United States Patent [19]

Suzuki

[11] Patent Number: 4,780,615
[45] Date of Patent: Oct. 25, 1988

[54] ALIGNMENT SYSTEM FOR USE IN PATTERN TRANSFER APPARATUS

[75] Inventor: Akiyoshi Suzuki, Tokyo, Japan

[73] Assignee: Canon Kabushiki Kaisha, Tokyo, Japan

[21] Appl. No.: 134,558

[22] Filed: Dec. 15, 1987

Related U.S. Application Data

[63] Continuation of Ser. No. 824,180, Jan. 30, 1986, abandoned.

[30] Foreign Application Priority Data

Feb. 1, 1985 [JP] Japan .................................. 60-16442
Oct. 16, 1985 [JP] Japan ................................. 60-228803

[51] Int. Cl.$^4$ ..................................... H01L 21/30
[52] U.S. Cl. ..................................... 250/548; 250/557; 356/400; 356/401
[58] Field of Search ................. 250/548, 557; 356/400, 356/401; 378/34, 35

[56] References Cited

U.S. PATENT DOCUMENTS

| | | | |
|---|---|---|---|
| 3,670,153 | 7/1972 | Rempert et al. | 250/548 |
| 4,167,677 | 9/1979 | Suzuki | 250/548 |
| 4,315,201 | 2/1982 | Suzuki et al. | 250/557 |
| 4,423,959 | 1/1984 | Nakazawa et al. | 356/401 |
| 4,492,459 | 1/1985 | Omata | 356/401 |
| 4,521,082 | 7/1985 | Suzuki et al. | 356/400 |
| 4,617,469 | 10/1986 | Takahashi et al. | 250/548 |
| 4,719,357 | 1/1988 | Ayata et al. | 250/548 |

Primary Examiner—Edward P. Westin
Assistant Examiner—Charles F. Wieland
Attorney, Agent, or Firm—Fitzpatrick, Cella, Harper & Scinto

[57] ABSTRACT

An alignment system usable in a semiconductor device manufacturing exposure apparatus for superimposingly transferring a circuit pattern of a reticle onto each of patterns formed on individual portions of a semiconductor wafer, for sequentially aligning the individual portions of the wafer with respect to the reticle by use of alignment marks formed in or on scribe lines defined between the individual portions of the wafer. An optical system for detecting the alignment marks is disposed outside the path of light used for the sake of pattern transfer. In the course of movement of the wafer for bringing a particular shot area to an exposure station, the alignment marks for the particular shot area are photoelectrically detected through the mark detecting optical system and, on the basis of the detection of the alignment marks, the reticle and the wafer are relatively moved into alignment such that, when the particular shot area reaches the exposure station, the pattern of the reticle can be accurately superimposed on the pattern already formed on the particular shot area of the wafer. As a result, TTL (through-the-lens) alignment is assured without degradation of throughput of the exposure apparatus.

14 Claims, 8 Drawing Sheets

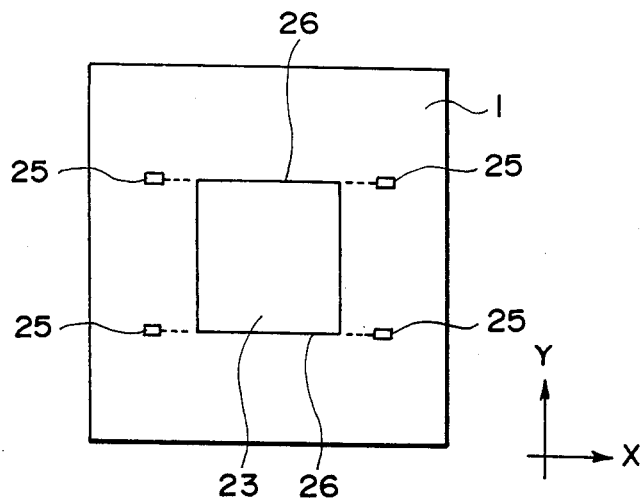
F I G. 4
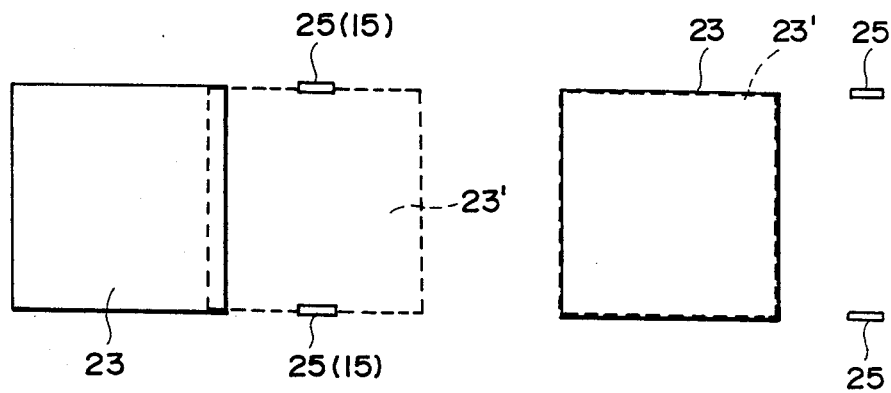
F I G. 5A          F I G. 5B

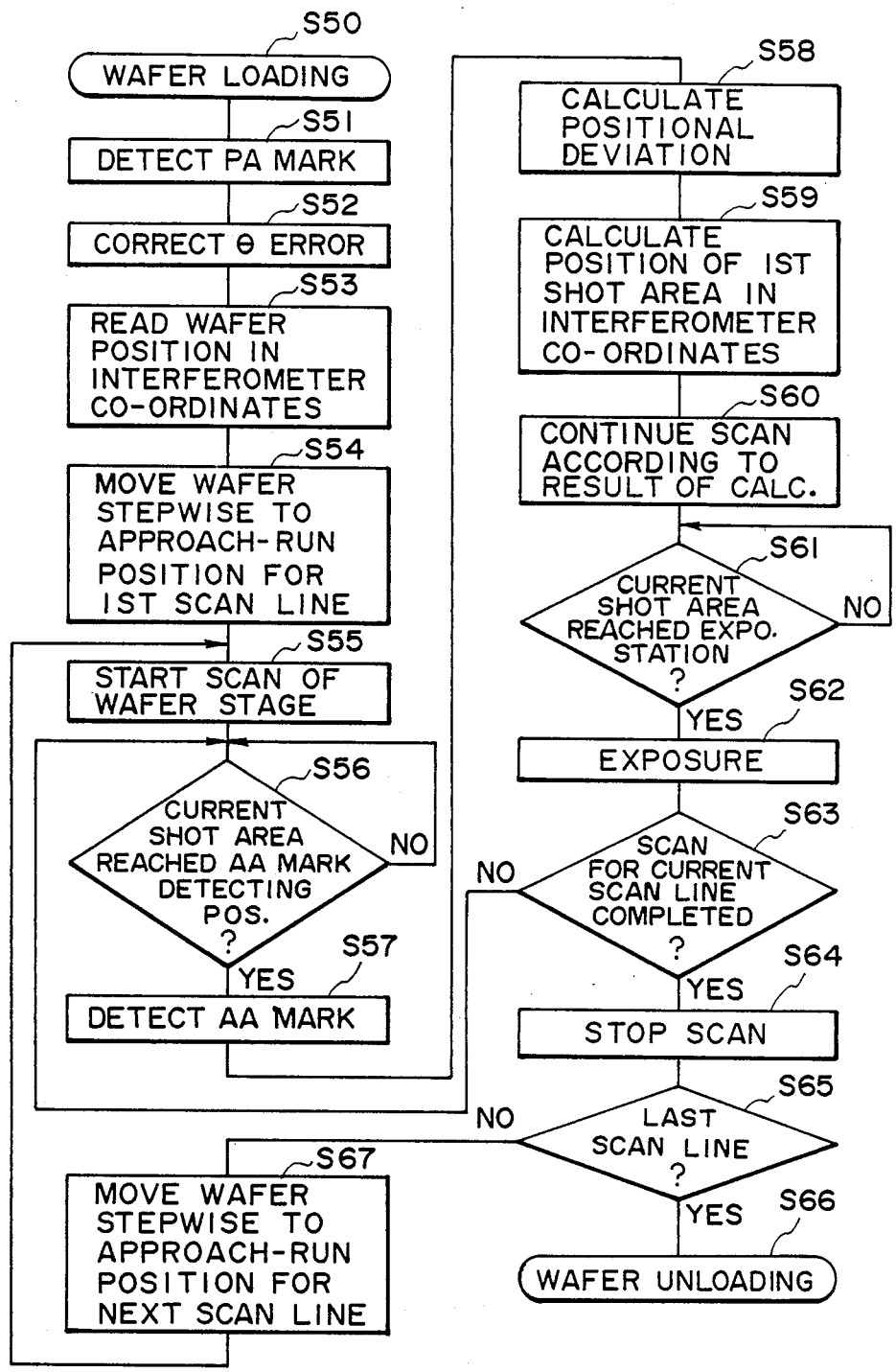
F I G. 12

ALIGNMENT SYSTEM FOR USE IN PATTERN TRANSFER APPARATUS

This application is a continuation of application Ser. No. 824,180 filed 1/30/86, now abandoned.

FIELD OF THE INVENTION AND RELATED ART

This invention relates to an alignment system and, more particularly, to an alignment system usable in a semiconductor device manufacturing exposure apparatus for superimposingly transferring a circuit pattern of a mask or reticle (hereinafter simply as "reticle") onto each of one or more patterns already formed on respective portions of a semiconductor wafer, for sequentially aligning or moving into alignment the portions of the wafer with respect to the reticle.

Recent rapid progress in the semiconductor devices such as integrated circuits (ICs), large-scale integrated circuits (LSIs), very large-scale integrated circuits (VLSIs), etc. has forced the reduction in the width of the lines, forming the circuit pattern, to an order less than 1 micron. To meet such requirement for miniaturization, step-and-repeat type alignment and exposure apparatusus (called "steppers") have been developed. This type of exposure apparatuses are prevalent in the field of manufacture of VLSIs.

While various types of alignment systems are incorporated into the steppers, generally they can be classified into two. One is an off-axis type. This type of alignment system is provided with a microscope (called "off-axis optics") in addition to an optical system for projecting an image of the circuit pattern of the reticle onto the semiconductor wafer. By use of this microscope, one or more alignment marks formed on the wafer are detected. The wafer is first moved into alignment, in X, Y and $\theta$ (rotational) directions, with respect to a reference which is preparatively defined in the off-axis system and, thereafter, the wafer is conveyed to an exposure station under the projection optical system. The exact distance between the off-axis system and the optical axis of the projection optical system is known, by preparatory measurement or the like. So, the movement of the wafer to the exposure station and the movement (stepwise movement) of the wafer for sequential exposures relative to individual portions of the wafer are controlled, while relying on the precision of a measuring device using a laser interferometer.

Since, in this off-axis alignment system, only one alignment operation is required for one wafer, the throughput of the exposure apparatus can be increased relatively easily. However, in this type of alignment system, any positional deviation between the reticle and the wafer is not detected for each of the exposures or shots. If, therefore, any irregularity is caused, for example, in the locations of the individual patterns already formed on the wafer, due to the deformation of the wafer by heat, due to the characteristics of another apparatus by which the wafer has been treated in another process, or for any other reason, it is not possible to acheeve accurate alignment of each of the individual portions of the wafer with the reticle. Therefore, it is not possible to accurately superimpose the circuit pattern of the reticle onto each of the individual patterns already formed on the wafer.

The other type is a TTL (through-the-lens) alignment system which has become more attractive in view of recent miniaturization of the semiconductor device. Briefly, this type of alignment system is arranged to detect one or more alignment marks of the wafer through or by way of a projection optical system, provided for projecting an image of the circuit pattern of the reticle onto the wafer. More specifically, each of the individual patterns on the wafer is provided with one or more alignment marks. By detecting the alignment marks for each pattern by way of the projection optical system, the reticle and the wafer are aligned with each other, for each of the sequential exposures or shots relative to the respective patterns on the wafer. Therefore, according to the TTL alignment system, the above-described problems involved in the off-axis alignment system can be obviated.

Where the TTL alignment technique is used to achieve alignment of the reticle and the wafer, for each of the shot areas on the wafer (this is called in the art as "die-by-die aligment"), it is necessary to provide each shot area of the wafer with one or more alignment marks at positions in close proximity to the shot area. Since the alignment marks are very close to the shot area onto which the pattern of the reticle is to be projected, optical systems for detecting the alignment marks by way of the projection lens system should be at positions which are so close to the shot area (pattern area) of the wafer that the detecting optical systems interfere with the path of the light to which the wafer is to be exposed. For this reason, conventional exposure apparatuses employing TTL die-by-die alignment systems are arranged such that the mark detecting optical systems are retracted, during exposure of each shot area, out of the path of the light exposing the wafer.

Displaceability of the detecting optical system between positions for the alignment and for the exposure leads to complication of the structure and requires a time period, after completion of the alignment and before the initiation of the exposure, necessary for displacing the detecting optical system from the one position to another. Therefore, the manufacturing cost of the exposure apparatus is increased, while the throughput of the apparatus is decreased.

SUMMARY OF THE INVENTION

It is accordingly a primary object of the present invention to provide an alignment system particularly suitable for use in an exposure apparatus for superimposingly transferring a pattern of a first object onto each of one or more patterns formed on respective portions of a second object, for allowing the TTL alignment without degrading the throughput of the exposure apparatus.

It is another object of the present invention to provide an alignment system suitable for use in an exposure apparatus for superimposingly transferring a pattern of a first object onto each of patterns formed on respective portions of a second object, for allowing the TTL alignment with a simple structure.

Briefly, according to one aspect of the present invention, there is provided a system usable in an apparatus for superimposingly transferring a pattern of a first object onto each of patterns formed on respective portions of a second object, for sequentially detecting alignment marks formed on a non-pattern area of the second object, other than the respective portions, for alignment of the respective portions of the second object with respect to the first object, said system comprising: driving means for moving the second object relative to the first object; first detecting means for detecting an alignment mark of the second object related to such one of the portions of the second object that is just going to be subjected to the transfer of the pattern of the first object, before the aforesaid one portion of the second object reaches a predetermined station at which the pattern of the first object is to be transferred onto the aforesaid one portion of the second object, on an occasion of movement of the second object in a first direction by said driving means; and second detecting means for detecting the alignment mark of the second object related to the aforesaid one portion before the aforesaid one portion reaches the predetermined station on an occasion of movement of the second object in a second direction, other than the first direction, by said driving means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a plan view showing an example of reticle alignment marks.

FIGS. 5A and 5B are schematic views showing the manner of alignment according to the FIG. 1 embodiment.

FIG. 12 is a flow chart showing another example of the flow of operation of the FIG. 1 embodiment, for allowing scanning exposures.

DESCRIPTION OF THE PREFERRED EMBODIMENTS

Figure 1:
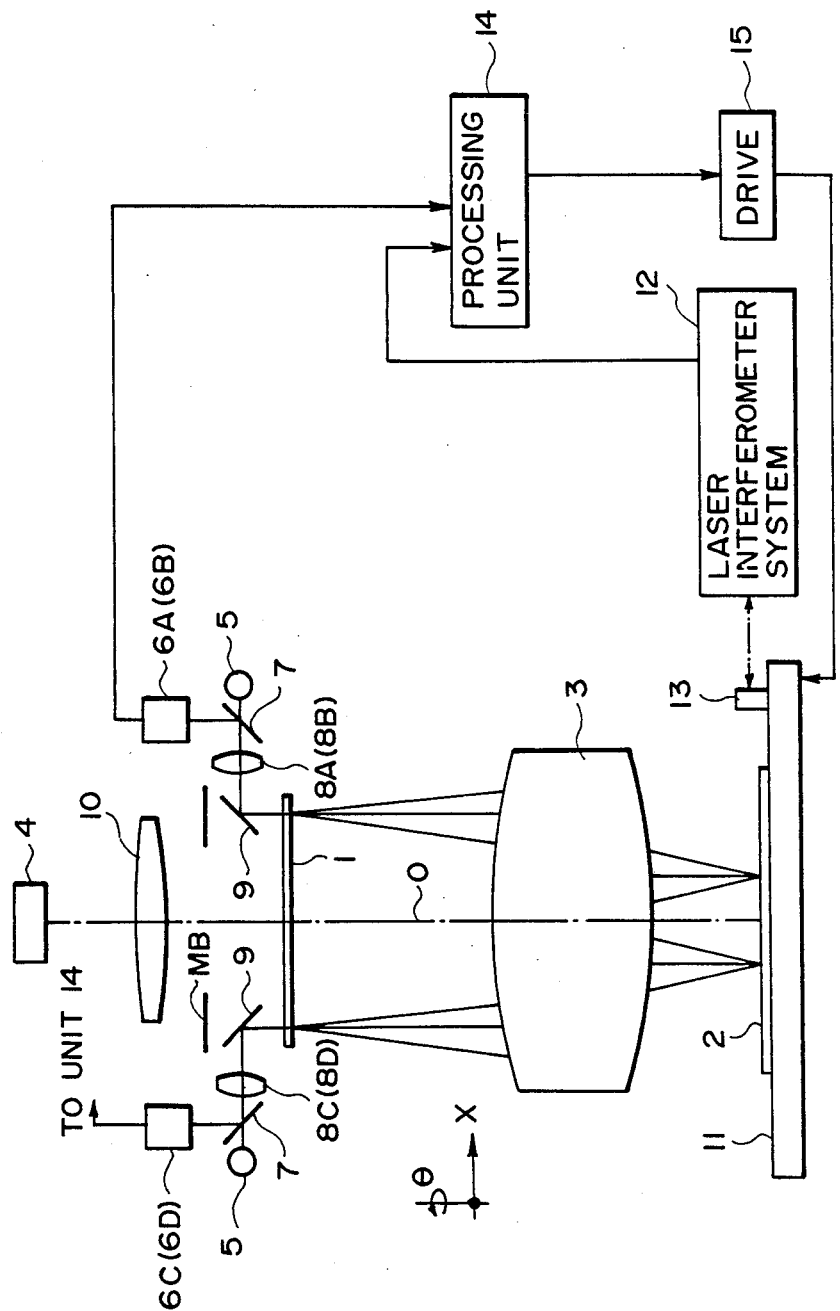
FIG. 1 is a schematic and diagrammatic view of a semiconductor device manufacturing exposure apparatus into which an alignment system according to one embodiment of the present invention is incorporated.

Referring first to FIG. 1, there is shown a semiconductor device manufacturing exposure apparatus of step-and-repeat type (i.e. a stepper) into which an alignment system according to one embodiment of the present invention is incorporated. The alignment system of this embodiment is arranged to detect any positional deviation between a reticle 1 and a semiconductor wafer 2 on the basis of simultaneous observation of alignment marks formed on the reticle 1 and the wafer 2.

In FIG. 1, denoted by numeral 3 is a projection lens for projecting an image of a circuit pattern of the reticle 1 onto the wafer 2 with a reduced magnification such as 1:5, for example; and denoted by numeral 4 is a radiation energy source such as a light source, comprising a super Hg lamp or the like, for producing a radiation energy such as a light to which a radiation-sensitive layer (e.g. a photoresist layer) on the wafer 2 is sensitive. An illumination optical system 10 is provided to uniformly irradiate the circuit pattern of the reticle 1 with the light from the light source 4. While not shown in the drawings, appropriate filter means is used to select a particular wavelength, e.g. a g-line, out of the light beam emitted from the light source 4. The projection lens system 3 is designed so that aberrations are corrected or fully suppressed relative to the light of the aforesaid particular wavelength. Also, in this embodiment, the projection lens system is of dual-telecentric type, i.e. is telecentric both on the object side and on the image side. An unshown laser device is provided to produce a laser beam which is introduced into the alignment system from each of four laser emitting portions 5—5. Four mark detecting units 6A–6D are provided which are arranged to photoelectrically detect alignment marks of the reticle 1 and the wafer 2 when they are illuminated by the laser beams from the emitting portions 5—5. While two mark detecting units are illustrated in FIG. 1, four such units are provided in association with four objective lenses 8A–8D (FIG. 2), each for one. The alignment system further includes four half mirrors 7—7 and four bending mirrors 9—9 for deflecting the laser beams in the direction substantially in parallel to the optical axis 0 of the projection lens system 3. Each of the laser beams introduced from the emitting portions 5—5 is directed to the reticle 1 by means of corresponding one of the half mirrors 7—7, corresponding one of the objective lenses 8A–8D and corresponding one of the mirrors 9—9. The laser beam incident on the reticle 1 passes therethrough and is directed to the wafer 2 by way of the projection lens system 3. When the laser beam is incident on the alignment marks of the reticle 1 and the wafer 2, it is scatteringly or diffractively reflected by the alignment marks. The scatteringly reflected components of the laser beam from the alignment marks of reticle 1 and the wafer 2 are introduced to corresponding one of the mark detecting units 6A–6D by way of corresponding one of the mirrors 9—9, corresponding one of the objective lenses 8A–8D and corresponding one of the half mirrors 7—7. As for the laser source, a He-Cd laser is used, for example, to provide a laser beam having substantially the same wavelength as that of the light from the light source 4.

Denoted by numeral 11 is a wafer stage for holding the wafer 2 for displacement in X, Y and $\theta$ (rotational) directions. A distance measuring system 12 including a laser interferometer is provided, which system is arranged to measure the amount of displacement of the wafer stage 11 in each of the X, Y and $\theta$ directions, by use of a mirror 13 fixedly mounted on the wafer stage 11. A processing unit 14 receives outputs of the mark detecting units 6A–6D and an output of the laser interferometer system 12, and controls the movement of the wafer stage 11 by way of a driving unit 15 so as to align the reticle 1 and the wafer 2. The processing unit 14 is arranged to calculate the positional deviation between the reticle 1 and the wafer 2 on the basis of the outputs of the mark detecting units 6A-6D, and to control the movement of the wafer stage 11. Also, the processing unit 14 has a function for controlling the exposure apparatus as a whole.

Figure 2:
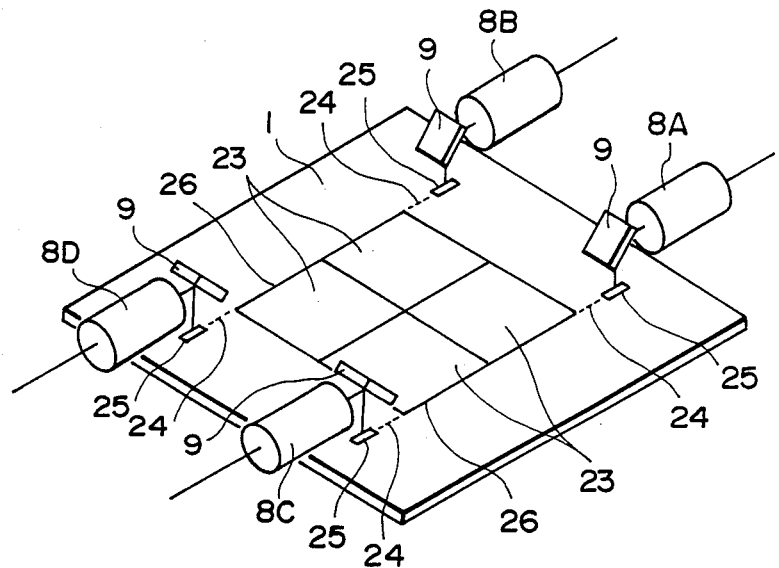
FIG. 2 is a perspective view of a portion of the alignment system of the FIG. 1 embodiment.

In this example, the reticle 1 has four actual circuit patterns 23—23 such as shown in FIG. 2. Also, four alignment marks (which hereinafter also as "AA marks") are formed on the reticle 1 in four areas 25—25 (hereinafter "AA mark areas") located at positions spaced from the circuit patterns 23—23 and on two phantom lines 24 passing through or extending along two scribe lines 26 at two opposite sides of the circuit patterns. The objective lenses 8A-8D are disposed so as to observe the AA mark areas 25—25, respectively. The phantom lines 24 extend in directions parallel to the direction of primary stepwise movement of the wafer stage 11 (hereinafter "primary stepwise moving direction"). If, for example, the exposures relative to the shot areas (pattern areas) of the wafer 2 are to be effected in the step-and-repeat manner in the order denoted by arrows B in FIG. 3, the primary stepwise-movement direction of the wafer stage 11 is in the X direction. Thus, in this example, as is best shown in FIG. 4, the AA mark areas 25—25 of the reticle 1 are formed at positions which are right on two phantom lines passing through two X-direction extending scribe lines 26, outermost ones in respect to the Y direction, and which are spaced from the circuit pattern area 23 in the positive and negative X directions by the same amount. The locations as such of the AA mark areas 25—25 are positions which do not interfere the light beam from the light source 4, even when the mirrors 9—9 are fixed, i.e. not retractable. So, in this embodiment, the mark detecting optical systems held stationary. Denoted by reference character MB is a masking blade which may be disposed, if necessary, to sharply define an illumination area on the reticle 1.

Figure 3:
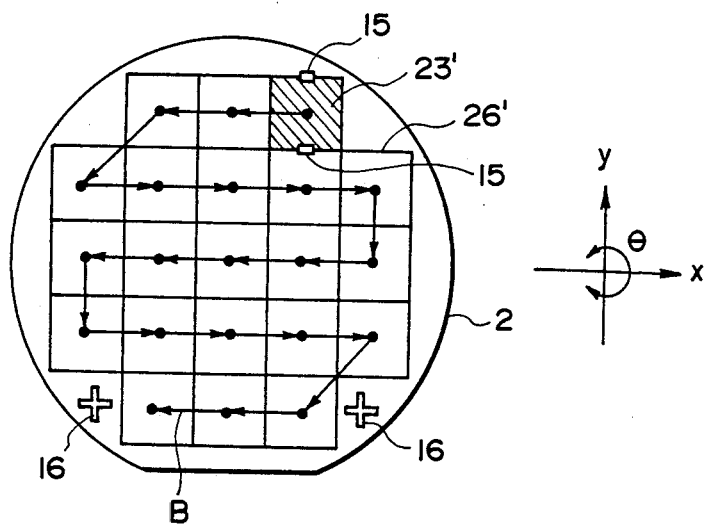
FIG. 3 is a schematic diagram showing the order of exposures and the direction of stepwise movement.
Figure 6:
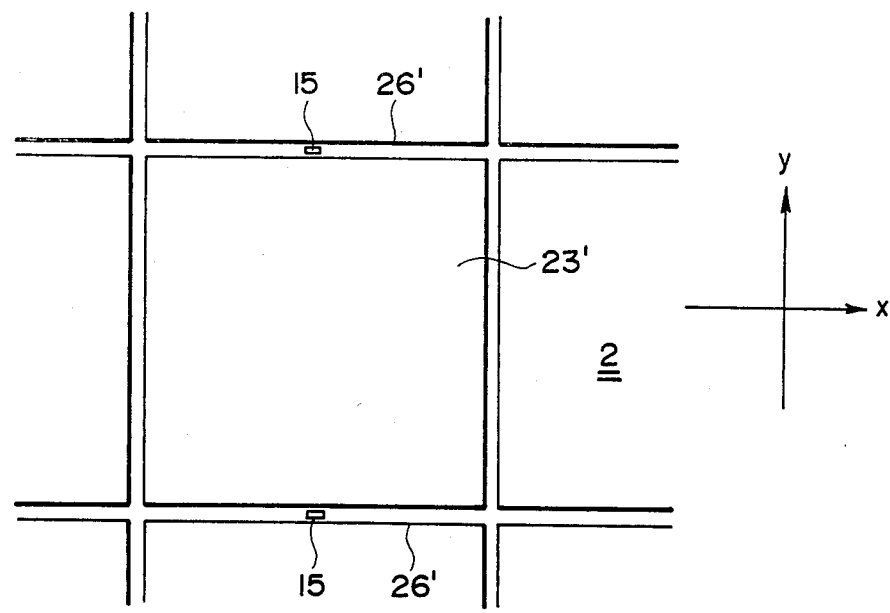
FIG. 6 is a fragmentary enlarged view showing a portion of the wafer of FIG. 2.

On the other hand, as shown in FIG. 3, the wafer 2 has formed thereon two prealignment marks 16 (hereinafter "PA marks") which are provided to allow preparatory alignment of the wafer 2 held by the wafer stage 11 so as to assure that two alignment mark areas 15 (hereinafter "AA mark areas") of the first shot area 23' of the wafer 2 are simultaneously brought into the viewfields of corresponding two of the objective lenses 6A-6D. As is best shown in FIG. 6, the AA mark areas 15 of the wafer 2 are formed in or on two scribe lines 26' extending in the X direction and at positions symmetrical with each other with respect to the center of the shot area 23'. While not shown in FIG. 3, each of the shot areas on the wafer 2 has two AA mark areas such as 15, formed in close proximity to it.

As for the specific arrangement of the alignment marks formed on the reticle 1 and the wafer 2 and the manner of calculation of the positional deviation between the reticle 1 and the wafer 2 on the basis of the detection of these alignment marks, reference may be made to U.S. Pat. No. 4,167,677 issued Sept. 11, 1979, assigned to the same assignee of the subject application. Also, as for the photoelectric detection of the alignment marks, any one of various known methods such as a laser scanning method, a TV scanning method, etc. is usable.

Referring now to FIGS. 5A and 5B, the process of alignment in the FIG. 1 embodiment will be described.

In this embodiment, detection of the reticle alignment marks and the wafer alignment marks, in relation to a particular shot area of the wafer, for detecting the positinal deviation between the reticle and the wafer in relation to the particular shot area is effected before the particular shot area reaches the exposure station under the projection lens system 3. More specifically, the wafer alignment marks formed in the two AA mark areas 15 of the wafer 2 and the reticle alignment marks formed in two of the AA mark areas 25 of the reticle 1 are detected when, during stepwise movement of the wafer 2 by the wafer stage 11, the AA mark areas 15 of the wafer 2 and the two AA mark areas 25 of the reticle 1 come into an overlapping relation with respect to the projection lens system 3. At this time, the particular shot area of the wafer does not yet reach the exposure station. From the detected alignment marks of the reticle 1 and the wafer 2, the positional deviation between the reticle 1 and the wafer 2 at the time of detection of the alignment marks, as shown in FIG. 5A is calculated. Then, the wafer stage 11 is further displaced by an amount corresponding to the sum of the detected positional deviation and the distance, which is known, between the exposure station and the AA mark areas 25 of the reticle 1, both as viewed on the plane of the wafer. By this, the particular shot area of the wafer is moved into alignment with the reticle 1 when it reaches the exposure station. So, the reticle 1 is illuminated by the light beam from the light source 4, whereby the wafer 2 is exposed to the light passed through the reticle 1 and, whereby the actual element pattern (circuit pattern) of the reticle 1 is transferred onto the wafer 2.

Since, in this embodiment, two alignment marks for each shot area of the wafer 2 are formed on the scribe lines extending in the primary stepwise-movement direction of the wafer, these alignment marks can be detected in the course of the stepwise movement in the same direction. And, the two alignment marks can be detected simultaneously. As a result, the sequence of the alignment operation can be simple, allowing high-speed alignment. Also, it is not necessary to retract the mark detecting optical systems such as mirrors 9 out of the path of the light from the light source 4, after the detection of the alignment marks.

In the embodiment of FIG. 1, as described, four objective lenses 8A-8D are provided. This is to meet the primary stepwise movement in two opposite directions, i.e. positive and negative X directions in FIG. 3 example. Where the wafer stage 11 is moved stepwise in a particular direction for the repetition of exposures in the order along the particular direction, an appropriate pair of the objective lenses are selected out of the four objective lenses 8A-8D to detect the alignment marks. By doing so, the amount of movement of the wafer stage can be reduced, thereby increasing the throughput significantly.

In the case of FIG. 5, for example, the alignment marks formed on two AA mark areas 25 which are located on the right-hand side of the circuit pattern 23 (FIG. 4) of the reticle 1 are used to detect the positional deviation between the reticle 1 and the wafer 2. The image of the shot area 23' of the wafer 2 which can be observed in the plane of the reticle 1 is moving at this time from right to left, i.e. in the negative X direction, as will be seen from FIGS. 5A and 5B. If, on the other hand, the primary stepwise movement of the wafer 2 is in the positive X direction as viewed on the reticle 1, the alignment marks formed on two AA mark areas 25 defined on the left-hand side of the circuit pattern 23 (FIG. 4) are used for the sake of detection of the positional deviation. Thus, in accordance with the selected alignment marks of the reticle 1, corresponding one pair of objective lenses are selected out of the four objective lenses 8A-8D.

According to another aspect of the present invention, the alignment system of the present invention is applicable to such an exposure apparatus which completes exposure per one shot on the wafer 2 in a remarkably short time. That is, according to the kind of radiation energy source used, the exposure for one shot can be completed in a time period of an order of several tends of microseconds. In such case, it is not always necessary to interrupt the movement of the wafer stage 11 each time one shot area of the wafer 2 reaches the exposure station. So, the exposures relative to plural shot areas of the wafer can be effected by intermittent irradiation by the light source 4 while continuously moving or scanning the wafer stage 11. Hereinafter, this type of exposure process will be referred to also as "scanning exposure". A high-power laser such as an excimer laser or the like will be suitable for the radiation energy source, i.e. the light source 4 in FIG. 1 embodiment. The present invention provides similar advantageous effects for such scanning exposure. That is, according to the present invention, the positional relation between the wafer 2 and the reticle 1 can be detected by use of the wafer alignment marks and the reticle alignment marks, the latter being formed in an appropriate pair of the four AA mark areas 25—25 (FIG. 4), before during scanning movement a particular shot area of the wafer 2 which is going to be subjected to the alignment and exposure operation reaches the exposure station under the projection optics. By calculating the positional deviation between the reticle 1 and the wafer 2 from the results of detection of the alignment marks, the positional deviation of the wafer 2 when the particular shot area just reaches the exposure station can be estimated. Such estimated positional deviation can be corrected preparatively and easily on the basis of calculation, similarly to the foregoing embodiment, by reading the position of the wafer stage at the time of detection of the alignment marks and the position of the wafer stage to be assumed at the time of exposure, with use of the laser interferometer. Thus, the wafer 2 is moved while correcting the positional error with respect to the reticle 1 before the particular shot area reaches the exposure station. When the particular shot area reaches the exposure station, the radiation energy source is energized to complete the exposure in a very short time. In this manner, the exposures relative to the whole surface of the wafer 2 can be accomplished while continuously moving the wafer stage 11.

Figure 7:
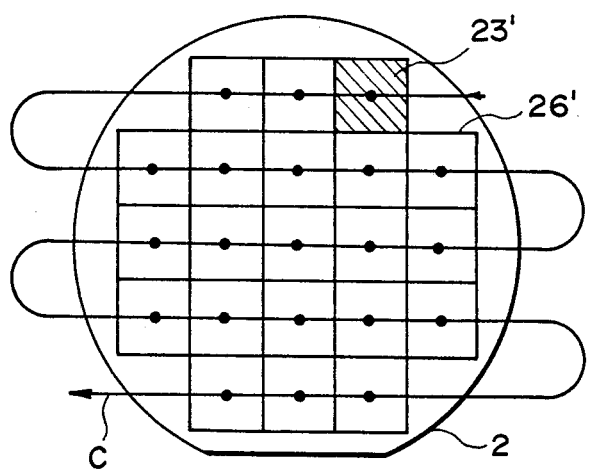
FIG. 7 is a schematic view showing the manner of movement of the wafer for allowing scanning exposures, in the embodiment of FIG. 1.

In order to achieve the above-described scanning exposure, approach-running and overrunning of the wafer stage are necessary. That is, the scanning movement of the wafer has to include overrunning portions such as denoted by an arrow C in FIG. 7, in order to assure preparatory detection of the positional deviation for any marginal shot area or areas of the wafer 2. During the approach-run state in which the wafer is moved back from the overrun position for the sake of exposures relative to shot areas in the next scanning line, the positional deviation with respect to the first shot area in that scanning line is preparatively detected. In the case of scanning exposure, the words "primary stepwise-moving direction" which have been referred to with reference to the first embodiment can be replaced by the words "primary scanning direction".

While the FIG. 1 embodiment is provided with two pairs of objective lenses, one of the two of each pair (a left-hand one and a right-hand one in FIG. 2) may be omitted if the $\theta$ (rotational) error of each shot area of the wafer is so small that satisfactory alignment is attainable only by the positional adjustment in the X and Y directions.

Figure 8:
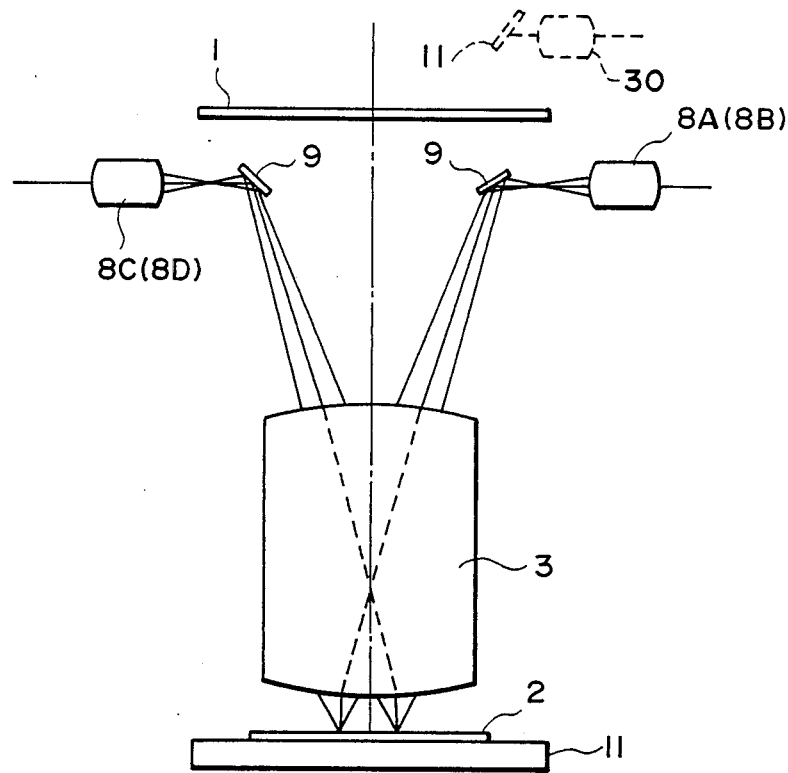
FIG. 8 is a schematic view of an alignment system according to another embodiment of the present invention.

Referring now to FIG. 8, an alignment system according to another embodiment of the present invention will be described. This embodiment is similar to the FIG. 1 embodiment except for that the alignment marks of the wafer 2 are detected by use of mirrors disposed between the reticle 1 and the projection lens system 3 and that the alignment marks of the reticle 1 are not detected. So, description will be made only to distinctive features of the present embodiment, and description of the similar portion will be omitted here by assigning the same reference numerals to elements having corresponding functions as of those of the FIG. 1 embodiment.

In the embodiment shown in FIG. 8, the objective lenses 8A-8D are not required to detect the reticle alignment marks and the wafer alignment marks simultaneously. Therefore, a wavelength of light different from that of the light used for the exposure may be used as the light for the alignment, to be introduced by the objective lenses 8A-8D. A light having a single wavelength or having a wavelength range is usable. The locations of the objective lenses 8A-8D are preparatively adjusted in accordance with the wavelength of the light used for the alignment and the mark detecting positions at which the alignment marks of the wafer 2 are to be detected. Also, the positional error of the wafer 2 is detected by detecting the positional deviation of the alignment marks on the wafer 2 with respect to reference marks preparatively formed on the objective lenses 8A-8D, respectively. The reticle 1 is preparatively set exactly in a predetermined relation with respect to the reference marks of the objective lenses 8A-8D.

Figure 10:
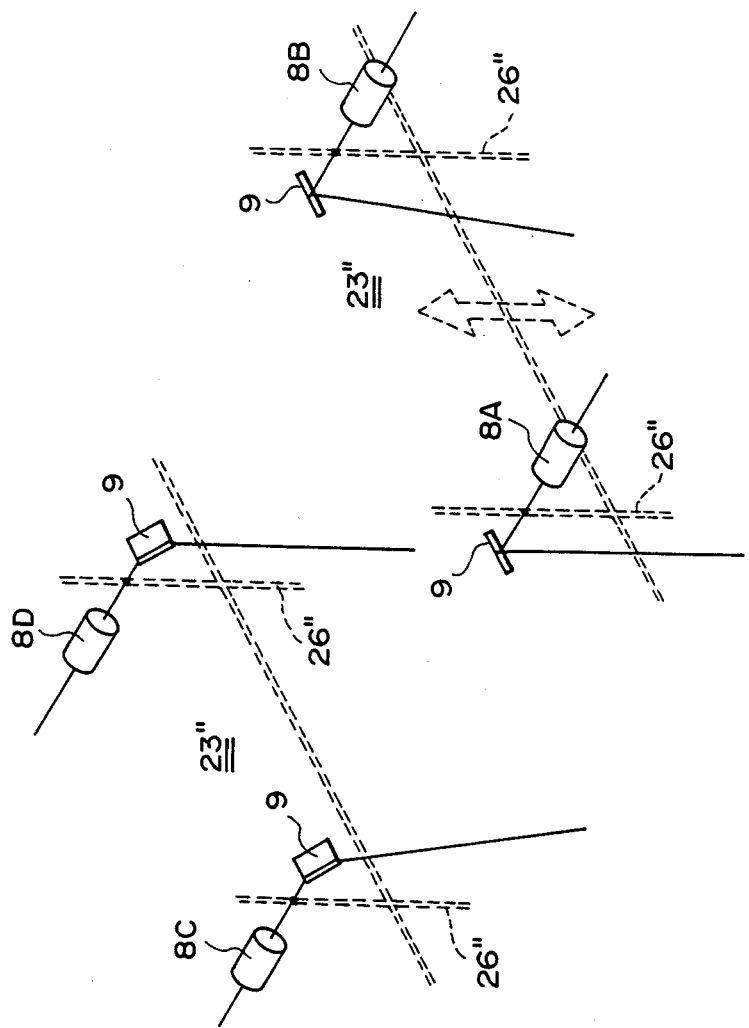
FIG. 10 is a schematic diagram showing a major portion of the alignment system of the FIG. 8 embodiment.

FIG. 10 shows the positional arrangement of the objective lenses 8A-8D and mirrors 9—9. Depicted in this Figure by broken lines are images 26" of the scribe lines of the wafer 2 which are formed by the combination of the projection lens system 3 and the mirrors 9—9. The images of the scribe lines, denoted at 26", are displaceable in the directions denoted by a double-headed arrow in the drawing. These opposite directions denoted by the arrow correspond to the positive and negative primary stepwise-moving directions described with reference to FIG. 3. One of the disctinctive features of the FIG. 8 embodiment lies in the point that two scribe lines extending in the direction corresponding to the primary stepwise-moving direction can be observed continuously. If the reticle 1 is replaced by another so that the mark detecting positions should be changed, the positions of the objective lenses 8A-8D and the positions of the mirrors 9—9 and the like are adjusted in accordance with the change in the mark detecting positions. This adjustment is required only at the time of replacement of the reticle 1 and, after the adjustment, the detecting optical system can be held fixed. This is effective to suppress any adverse effect against the throughput of the exposure apparatus.

In FIG. 10, the objective lenses 8A and 8B mate with each other, while the objective lenses 8C and 8D mate with each other, thus providing two pairs. By the preparatory adjustment, these two pairs of objective lenses are arranged to observe the scribe lines 26' of the wafer 2 (FIG. 9) by way of the projection lens system 3. The manner of determination of the pairs for the objective lenses 8A-8D depends on the primary stepwise-moving direction of the wafer 2. For example, the pair of objective lenses 8A and 8B are adapted to continuously observe two scribe lines 26' (FIG. 9) with respect to the primary stepwise-moving direction, provided that the wafer 2 continues its movement in the same direction. Similarly to the first embodiment, alignment marks of the wafer 2 are formed on or in the scribe lines 26', respectively.

Also, in this embodiment, it is an ultimate object of the exposure apparatus to transfer the image of the circuit pattern of the reticle 1 onto the wafer 2. So, also in this embodiment, the relative position of the reticle 1 and the detecting optical system including the objective lenses 8A-8D, mirrors 9—9, etc. should be considered. As for this, preparatory calibration will be necessary, by use of reference marks or a standard wafer. As a practical method for such calibration, the reticle 1 and the wafer 2 when they are in alignment are observed simultaneously by use of an additional optical system comprising, e.g., an objective lens 30 and a mirror 31 (FIG. 8) and by way of the projection lens system 30. On the basis of the result of observation or detection, the position of the reticle and/or the position of the detecting optical system is adjusted. Alternatively, the pattern transfer onto the wafer is actually effected and, in accordance with the measurement of the result of pattern transfer, similar adjustment may be effected. Placing the detecting optical system under the reticle 1 advantageously allows observation of the alignment marks of the wafer 2 by way of the projection optical system 3, even if a wavelength of light different from that of the light for the exposure is used as the light for the alignment. Usually, the projection optical system 3 shows outstanding chromatic aberration relative to wavelengths other than the wavelength of light to be used for the exposure. Therefore, when a wavelength other than that of the light for exposure is used for the alignment, it is difficult to observe the reticle 1 and the wafer 2 simultaneously. Such a problem can be obviated according to the embodiment of FIG. 8. That is, in accordance with the present embodiment, the detecting optical system is disposed between the reticle 1 and the projection lens system 3. This allows easy observation of the wafer 2 without any effect of the reticle 1, even when a wavelength other than that of the light for the exposure is used.

Figure 9:
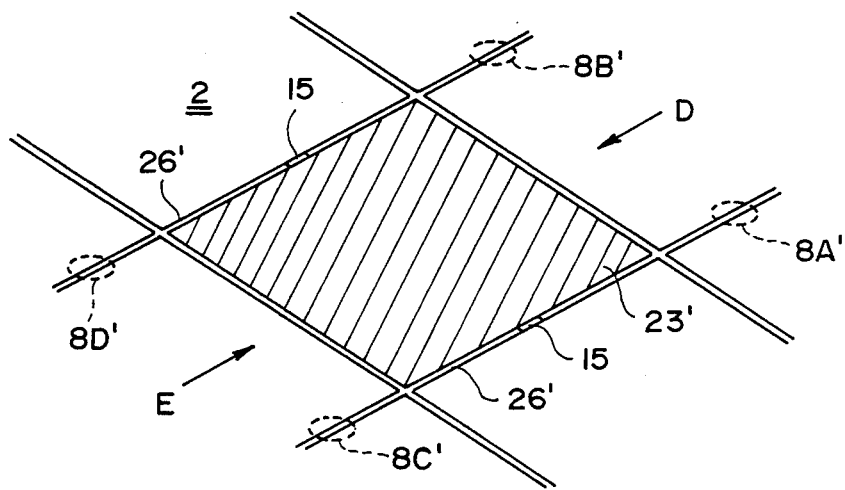
FIG. 9 is a fragmentary perspective view schematically showing the positional relationship between an exposure area on the wafer and alignment mark detecting positions.

Referring back to FIG. 9, the alignment marks of the wafer 2 formed in the AA mark areas 15 are detected by an appropriate pair of the objective lenses 8A-8D when these alignment marks reach, during movement of the wafer 2, corresponding two of four mark detecting positions 8A'-8D'. These mark detecting positions 8A'-8D' correspond respectively to the objective lenses 8A-8D and, as shown in FIG. 9, they are fixedly set on two lines passing through or extending along two scribe lines 26', for a particular shot area which is going to be subjected to the alignment and exposure operation, located at the opposite sides of the particular shot area with respect to the primary stepwise-moving direction. The positions of the objective lenses 8A-8D and the mirrors 9—9, defining the mark detecting positions 8A'-8D' at the illustrated locations, do not interfere with the path of light exposing the wafer 2. The provision of four objective lenses such as 8A-8D in this embodiment is made for the same reason as that of the FIG. 1 embodiment. Namely, where the primary stepwise-moving direction is in the direction denoted by an arrow D in FIG. 9 and where the wafer 2 is moved in the same direction, the alignment marks of the wafer 2 are detected by use of the objective lenses 8A and 8B. On the other hand, where the wafer 2 is moved in the opposite direction as denoted by an arrow E, the alignment marks of the wafer 2 are detected by another pair of objective lenses 8C and 8D. The manner and sequence of the alignment in this embodiment is essentially the same as that of the foregoing embodiment. Also, this embodiment is effectively applicable to an exposure apparatus of the scanning exposure type as described.

Description will now be made to the alignment and exposure operations of the foregoing embodiments while referring to the flow charts of FIGS. 11 and 12 and taking the FIG. 1 embodiment as a representative example.

Figure 11:
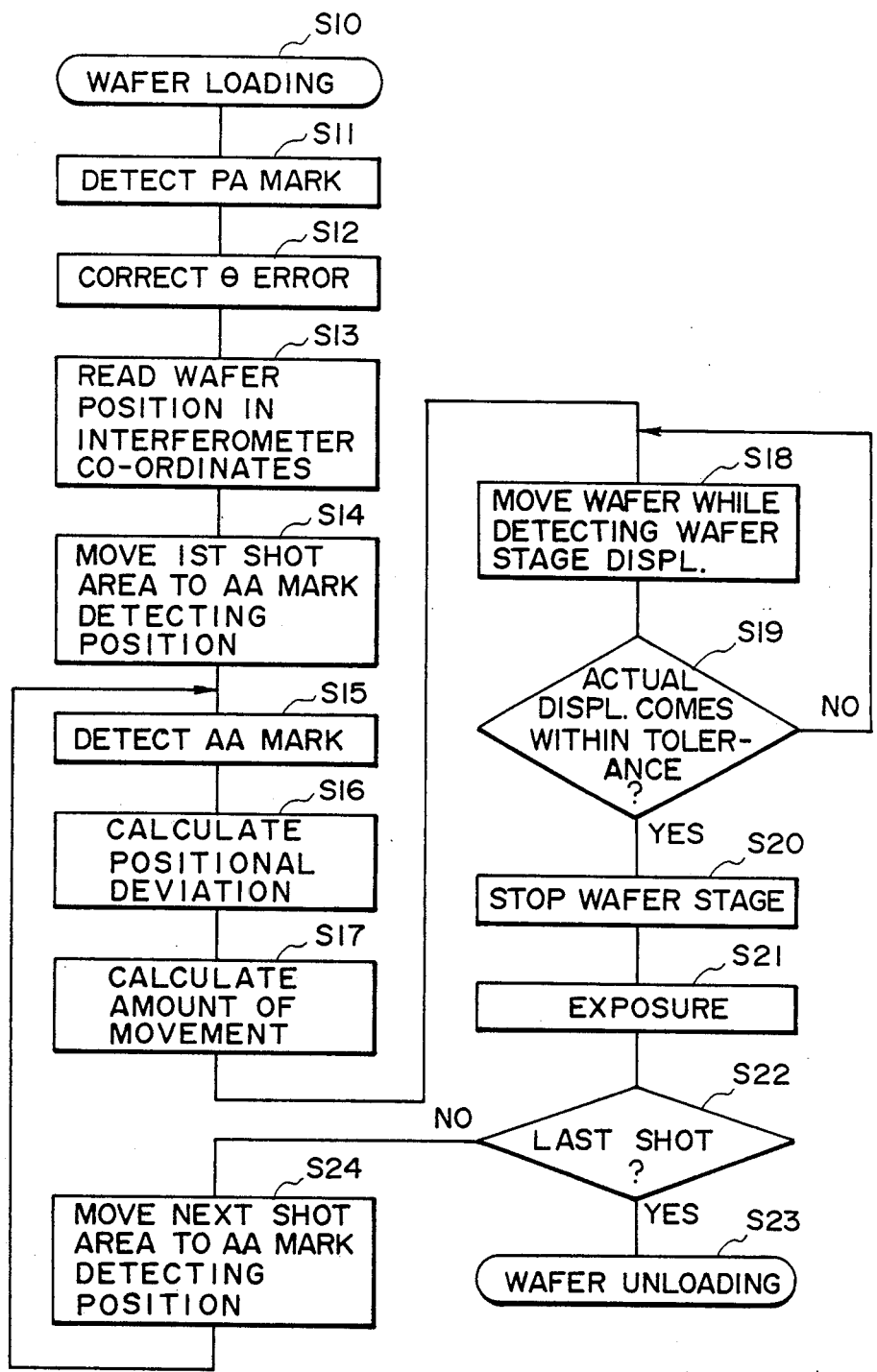
FIG. 11 is a flow chart showing the flow of operation of the FIG. 1 embodiment.

FIG. 11 shows the flow of the alignment and exposure operation to be effected while moving the wafer 2 stepwise. First, at Step S10, the wafer 2 is loaded onto the wafer stage 11. Then, at Step S11, the PA marks 16 of the wafer 2 are detected by means of a unshown optical system. On the basis of the result of detection of the PA marks 16, any $\theta$ (rotational) error of the wafer 2 held on the wafer stage 11 is corrected so that the scribe lines 26' of the wafer are brought into a substantially parallel relation with the primary stepwise-moving direction. Subsequently, at Step S13, the position of the wafer 2 loaded onto the wafer stage 11 in respect to the coordinates of the laser interferometer system 12 is read and, on the basis of the result of reading and the result of detection of the PA marks 16, the wafer stage 11 is moved (Step S14) so as to move the first shot area 23' of the wafer 2 to the alignment mark detecting position, at which appropiate two AA mark areas 25 of the reticle 1 are substantially superimposed on the AA mark areas 15 of the wafer 2 by way of the projection lens system 3. At Step S15, these alignment marks are detected and, at Step S16, the positional deviations in the X, Y and $\theta$ directions are calculated. Then, at Step S17, a calculation is made to obtain the amount of movement or displacement which corresponds to the sum of the detected positional deviations and the distance between the alignment mark detecting position and the exposure station under the projection lens system 3.

After the calculation at Step S17, the wafer stage is moved while detecting or measuring the wafer stage displacement by the laser interferometer system 14. If the amount of actual displacement of the wafer stage 11 comes within the predetermined tolerance (Step S19), the sequence proceeds to Step S20 so that the wafer stage movement is stopped. If the tolerance is not yet satisfied, the wafer stage movement is continued (Step S18). After the wafer stage 11 is stopped (Step S20), the exposure of a particular shot area (current shot area) is effected (Step S21). Subsequently, at Step S22, whether or not the current shot area is the last shot area of the wafer 2 is discriminated. If not the last shot area, the sequence proceeds to Step S24, whereby the next shot area of the wafer 2 is moved to the alignment mark detecting position. So, the sequence returns to Step S15 and the above-described operations are repeated. If the last shot area is exposed (Step S22), the wafer on the wafer stage 11 is unloaded (Step S23), so that the sequence returns to Step S10. It will be seen that, at Step S24, the wafer stage 11 may be stopped or, alternatively, the movement of the stage may be continued.

FIG. 12 shows the flow of the alignment and exposure operation in the case of scanning exposure. Steps S50-S53 of this flow chart correspond to Steps S10-S13 of the flow of FIG. 11, respectively. At Step S54, the wafer 2 is moved to an approach-run start position for the first scan line including the first area 23' of the wafer 2. Then, at Step S55, the scanning movement of the wafer 2 by the stage 11 is initiated. When, during scanning movement of the wafer 2, the AA mark areas of a particular shot area (current shot area) which is going to be subjected to the alignment and exposure operation, reaches the alignment mark detecting position, it is discriminated at Step S56 and the alignment marks are detected at Step S57. Then, at Step S58, the positional deviations of the current shot area with respect to the reticle 1 are calculated. On the basis of the thus detected positional deviations, of the distance between the alignment mark detecting position and the exposure station under the projection lens, and of the current position of the wafer stage 11, the position of the particular shot area (current shot area) of the wafer with respect to the coordinates of the laser interferometer system 12 is detected by calculation (Step S59). Thus, the scanning movement of the wafer is continued in accordance with the result of this calculation (Step S60). Whether or not the current shot area reaches the exposure station is discriminated (Step S61), from the output of the laser interferometer system 12. When the current shot area reaches the exposure station, the sequence proceeds to Step S62 whereat the wafer 2 is exposed to one or more pulses of the radiation energy supplied from the radiation energy source 4 adapted, in this case, to produce a radiation energy in the form of pulses.

Subsequently, at Step S63, discrimination is made as to whether the scanning movement of the wafer for one complete scan line (current scan line) is completed or not. If not completed, the sequence returns to Step S56 and the above-described operations from Step S56 to Step S63 are repeated. If completed, on the other hand, the scanning movement of the wafer stage 11 is stopped (Step S64) and, thereafter, a discrimination is made as to whether the scanning movement of the wafer for the last scan line is completed or not (Step S65). If not yet completed, the sequence proceeds to Step S67 whereat the wafer stage 11 carrying the wafer 2 is moved to an approach-run start position for the next scan line. And, the sequence returns to Step S55 so that the above-described alignment and exposure operation is repeated. If completed, on the other hand, the wafer 2 is unloaded from the wafer stage 11 (Step S66), and the sequence returns to Step S50, for the loading of another wafer.

In accordance with the present invention, as has hitherto been described, the necessity of retracting the detecting optical system at the time of exposure is eliminated. Therefore, the TTL alignment is attainable without degrading the throughput of the exposure apparatus. Also, the present invention assures the TTL alignment in the case of scanning exposure, without interrupting the scanning movement of the wafer.

While the invention has been described with reference to the structures disclosed herein, it is not confined to the details set forth and this application is intended to cover such modifications or changes as many come within the purposes of the improvements or the scope of the following claims.

What is claimed is:

1. A system usable in an apparatus for superimposingly transferring a pattern of a first object onto each of one or more patterns formed on respective portions of a second object, for sequentially detecting alignment marks formed on a non-pattern area of the second object, other than the respective portions, for alignment of the respective portions of the second object with respect to the first object, said system comprising:
    driving means for moving the second object relative to the first object;
    first detecting means for detecting an alignment mark of the second object related to a first one of the portions of the second object which portion is just going to be subjected to the transfer of the pattern of the first object, before the first portion of the second object reaches a predetermined station at which the pattern of the first object is to be transfered onto the first portion of the second object, on an occasion of movement of the second object in a first direction by said driving means; and
    second detecting means for detecting an alignment mark of the second object related to a second one of the portions of the second object before said second portion reaches the predetermined station on an occasion of movement of the second object in a second direction opposite to the first direction, by said driving means.

2. A system according to claim 1, wherein said driving means moves stepwise the second object relative to the first object.

3. A system according to claim 1, wherein said driving means moves continuously the second object relative to the first object.

4. A system according to claim 1, wherein the non-pattern area of the second object is elongated and wherein said driving means moves the second object relative to the first object along the direction of elongation of the non-pattern area.

5. A system according to claim 1, wherein each of said first and second detecting means includes a plurality of detecting optical systems for detecting, simultaneously, plural alignment marks formed on the second object in relation to the aforesaid one portion.

6. A system according to claim 1, wherein the first object has an alignment mark and wherein each of said first and second detecting means is adapted to detect, simultaneously, the alignment mark of the first object and the alignment mark of the second object related to the aforesaid one portion.

7. A system according to claim 1, and for use in an apparatus as aforesaid haivng an optical system for projecting an image of the pattern of the first object onto the second object, wherein each of said first and second detecting means is adapted to detect the alignment mark of the second object related to the aforesaid one portion, by way of the projecting optical system.

8. A system usable in an apparatus for superimposingly transferring a pattern of a first object onto each of patterns formed on respective portions of a second object, for sequentially aligning the portions of the second object with respect to the first object by use of alignment marks formed on a non-pattern area of the second object other than the portions, said system comprising:
    driving means for moving the second object relative to the first object;
    first detecting means for detecting an alignment mark of the second object related to a first one of the portions of the second object which portion is just going to be subjected to the transfer of the pattern of the first object, before the first portion of the second object reaches a predetermined station at which the pattern of the first object is to be transferred onto the first portion of the second object, on an occasion of movement of the second object in a first direction by said driving means;

second detecting means for detecting an alignment mark of the second object related to a second one of the portions of the second object before said second portion reaches the predetermined station on an occasion of movement of the second object in a second direction opposite to the first direction, by said driving means; and means for adjusting the relative position of the first and second objects so as to align the first portion of the second object with respect to the first object on the basis of the detection by said first detecting means in an intance where the second object is moved in the first direction by said driving means, and to align the second portion of the second object with respect to the first object on the basis of the detection by said second detecting means in an instance where the second object is moved in the second direction by said driving means.

9. A system according to claim 8, wherein said adjsting means is operative to adjust the relative position of the first and second object during a time period after one of said first and second detecting means detects the alignment mark of the second object related to the aforesaid one portion and before the aforesaid one portion of the second object reaches the predetermined station by the movement of the second object relative to the first object.

10. A method usable in superimposingly transferring a pattern of a first object onto each of patterns formed on respective portions of a second object, for sequentially detecting alignment marks formed on a non-pattern area of the second object, other than the respective portions, for alignment of the respective portions of the second object with respect to the first object, said method comprising the steps of:

moving the second object relative to the first object;

detecting, by use of a first detecting means, an alignment mark of the second object related to a first one of the portions of the second object which portion is just going to be subjected to the transfer of the pattern of the first object, before the first portion of the second object reaches a predetermined station at which the pattern of the first object is to be transferred onto the first portion of the second object, on an occasion of movement of the second object in a first direction; and detecting, by use of second detecting means, the alignment mark of the second object related to a second one of the portions of the second object before said second portion reaches the predetermined station on an occassion of movement of the second object in a second direction opposite to the first direction.

11. An alignment method usable in superimposingly transferring a pattern of a first object onto each of patterns formed on respective portions of a second object, for sequentially aligning the portions of the second object with respect to the first object by use of alignment marks formed on a non-pattern area of the second object other than the portions, said method comprising the steps of:

moving the second object relative to the first object;

detecting, by use of a first detecting means, an alignment mark of the second object related to a first one of the portion of the second object which portion is just going to be subjected to the transfer of the pattern of the first object, before the first portion of the second object reaches a predetermined station at which the pattern of the first object is to be transferred onto the first portion of the second object, on an occasion of movement of the second object in a first direction; and detecting, by use of second detecting means, the alignment mark of the second object related to a second one of the portions of the second object before said second portion reaches the predetermined station on an occasion of movement of the second object in a second direction opposite to the first direction; and adjusting the relative position of the first and second objects so as to align the first portion of the second object with respect to the first object on the basis of the detection of the alignment mark by the first detecting means in an instance where the second object is moved in the first direction, and to align the second portion of the second object with respect to the first object on the basis of the detection of the alignment mark by the second detecting means in an instance where the second object is moved in the second direction.

12. An alignment system usable, upon sequentially transferring a pattern of a first object onto different shot areas of a second object, for sequentially aligning the shot areas of the second object, said system comprising:

a movable stage for supporting the second object;

a first detector operable, when said movable stage is moved in a first direction along an array of the shot ares of the second object so as to move a first one of the shot areas to a pattern transfer position, to detect an alignment mark formed on the second object in relation to said first shot area;

a second detector operable, when said movable stage is moved in a second direction opposite to said first direction so as to move second one of the shot areas of the second object to the pattern transfer position, to detect other alignment marks formed on the second object in relation to said second shot area; and control means for controlling the movement of said movable stage, said control means controlling the movement of said movable stage on the basis of the detection by said first detector when said movable stage is moved in the first direction so as to move said first shot area to the pattern transfer position, and said control means controlling the movement of said movable stage on the basis of the detection by said second detector when said movable stage is moved in the second direction so as to move said second shot area to the pattern transfer position.

13. A system according to claim 12, wherein said control means includes a measuring device for measuring, by use of a laser interferometer, a value related to the movement of said movable stage.

14. A system according to claim 12, wherein each of said first and second detectors has an objective lens system and wherein each objective lens sytem has a field of view which is relatively displaceable to the second object while observing a non-shot area of the second object, when said movable stage is moved along the direction of the array of the shot areas.

* * * * *

UNITED STATES PATENT AND TRADEMARK OFFICE
CERTIFICATE OF CORRECTION

PATENT NO. : 4,780,615
DATED : October 25, 1988
INVENTOR(S) : AKIYOSHI SUZUKI

Page 1 of 3

It is certified that error appears in the above-identified patent and that said Letters Patent is hereby corrected as shown below:

COLUMN 1

Line 14, "(hereinafter simply" should read --(hereinafter referred to simply--.
    Line 26, "apparatusus" should read --apparatuses--.
    Line 62, "acheeve" should read --achieve--.

COLUMN 2

Line 19, "aligment")," should read --alignment"),--.

COLUMN 5

Line 7, "(which hereinafter" should read --(which are referred to hereinafter--.
    Line 31, "interfere" should read --interfere with--.
    Line 34, "held" should read --are held--.

COLUMN 6

Line 1, "positinal" should read --positional--.

COLUMN 7

Line 10, "tends" should read --tens--.

COLUMN 8

Line 51, "disctinctive" should read --distinctive--.

UNITED STATES PATENT AND TRADEMARK OFFICE
CERTIFICATE OF CORRECTION

PATENT NO. : 4,780,615
DATED : October 25, 1988
INVENTOR(S) : AKIYOSHI SUZUKI

It is certified that error appears in the above-identified patent and that said Letters Patent is hereby corrected as shown below:

COLUMN 9

Line 25, "projection lens system 30." should read --projection lens system 3.--.

COLUMN 10

Line 38, "appropiate" should read --appropriate--.

COLUMN 11

Line 8, "first area 23'" should read --first shot area 23'--.
    Line 65, "many" should read --may--.

COLUMN 12

Line 26, "direction" should read --direction,--.

COLUMN 13

Line 12, "direction" should read --direction,--.
    Line 18, "intance" should read --instance--.
    Line 25, "adjst-" should read --adjust- --.
    Line 57, "occassion" should read --occasion--.
    Line 58, "direction" should read --direction,--.

UNITED STATES PATENT AND TRADEMARK OFFICE
CERTIFICATE OF CORRECTION

PATENT NO. : 4,780,615
DATED : October 25, 1988
INVENTOR(S) : AKIYOSHI SUZUKI

It is certified that error appears in the above-identified patent and that said Letters Patent is hereby corrected as shown below:

COLUMN 14

Line 3, "portion" should read --portions--.
Line 35, "ares" should read --areas--.
Line 41, "move second" should read --move a second--.

Signed and Sealed this

Third Day of December, 1991

Attest:

HARRY F. MANBECK, JR.

*Attesting Officer* — *Commissioner of Patents and Trademarks*